United States Patent [19]

Currier

[11] Patent Number: 4,539,621
[45] Date of Patent: Sep. 3, 1985

[54] INTEGRATED CIRCUIT CARRIER AND ASSEMBLY

[75] Inventor: David W. Currier, Algonquin, Ill.

[73] Assignee: Motorola, Inc., Schaumburg, Ill.

[21] Appl. No.: 450,891

[22] Filed: Dec. 20, 1982

[51] Int. Cl.³ .............................................. H05K 7/20
[52] U.S. Cl. ................................ 361/386; 339/17 CF;
361/212; 361/405; 361/424
[58] Field of Search .................. 357/74, 81; 165/80 B,
165/80 D, 104.33, 185; 174/52 FP; 339/174,
176 MP, 17 CF; 361/386–389, 395, 399, 400,
404, 405, 412, 413, 417–420, 212, 220, 406, 424

[56] References Cited

U.S. PATENT DOCUMENTS

| | | | |
|---|---|---|---|
| 3,311,790 | 3/1967 | Vizzier, Sr. | 361/387 |
| 3,495,131 | 2/1970 | Melcher | 361/418 |
| 3,685,002 | 8/1972 | Kennedy | 174/52 FP |
| 3,846,734 | 11/1974 | Pauza | 174/52 FP |
| 4,356,532 | 10/1982 | Donaher et al. | 361/393 |
| 4,417,777 | 11/1983 | Bamford | 339/17 CF |
| 4,421,368 | 12/1983 | Saban | 339/17 CF |

OTHER PUBLICATIONS

T&B/Ansley Corporation Carrier Drawings, 15912 dated Jun.-Nov. 1981.
Design News pp. 108–109, May 24, 1982 Article, "Connector Optimizes Plug in Memories".
Newark Electronics 1974 Catalog, pp. 336, 358.
1976 Cramer Catalog pp. 528, 532, 554.

Primary Examiner—G. P. Tolin
Attorney, Agent, or Firm—Phillip H. Melamed

[57] ABSTRACT

An integrated circuit (IC) assembly 10 using an IC carrier is disclosed. An IC 15 and IC carrier together form a carrier subassembly 11 in which two parallel rows of IC leads 20 and 21 are received by carrier contacts 28 mounted in openings 27 in a horizontal portion 14 of a main carrier member 13. Extending pin portions 30 of the carrier contacts vertically extend from the horizontal portion openings into two carrier channels 31 and 32 wherein the extending pin portions and carrier channels are dimensioned so as to recess the pin portions and prevent finger access thereto. A socket subassembly 12 is provided comprising a main socket member 40 having two raised islands 44 and 45 each with a row of socket contacts 41 fixed therein. Each socket island is dimensioned for removably fitting within one of the carrier channels with the carrier pin portions mating with the socket contacts. The main carrier member is provided with a heat sink 25 on which the IC is mounted, and the horizontal portion 14, main carrier sidewalls 17 and a cover 16 form a main carrier cavity 18 in which the IC is mounted. The socket subassembly is mounted to a printed circuit board 49. The recessing of carrier pin portions in the carrier channels permits manually handling the carrier subassembly 11 without risking static electricity discharge damage to the IC or mechanical lead damage.

41 Claims, 4 Drawing Figures

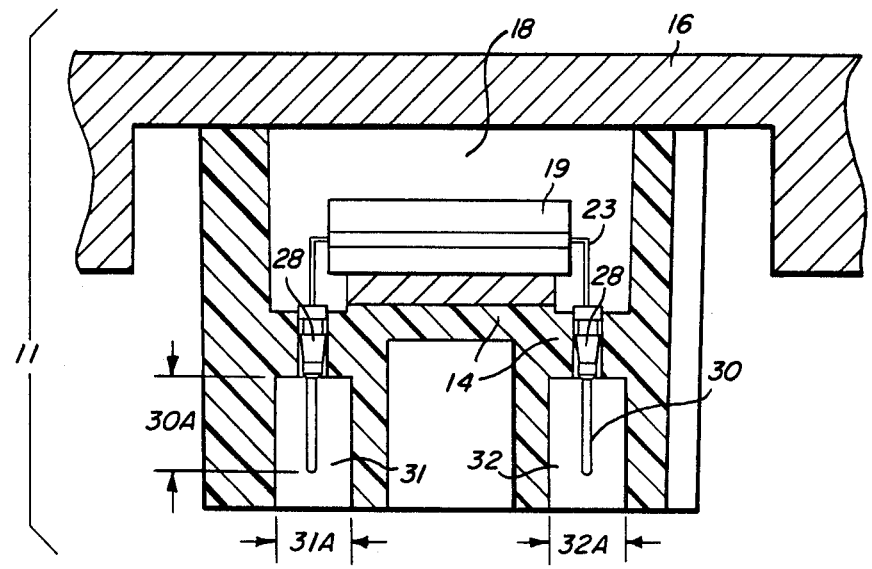
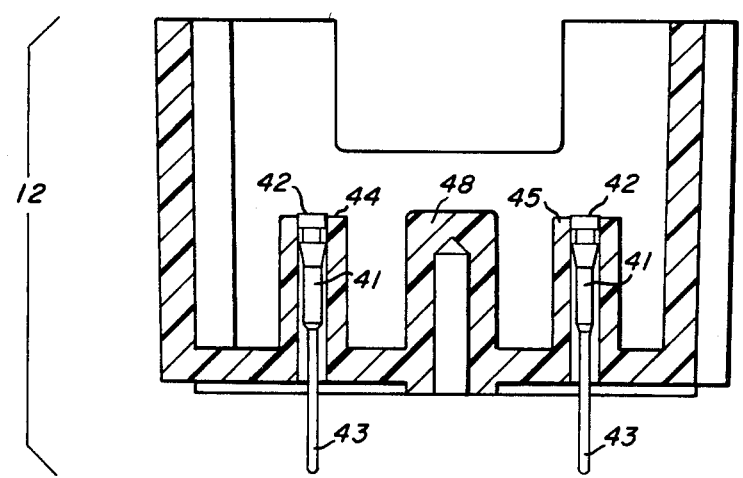
FIG. 2

INTEGRATED CIRCUIT CARRIER AND ASSEMBLY

BACKGROUND OF THE INVENTION

The present invention is generally related to the field of integrated circuit (IC) carriers and IC assemblies which utilize such carriers. The present invention is more specifically related to the field of dual-in-line package (DIP) carriers and assemblies.

Dual-in-line sockets for directly receiving dual-in-line packaged IC's are known. Typically the sockets are soldered to a printed circuit board and the IC can then be removably inserted into the socket to create an IC assembly with each IC external lead mating with a socket contact provided in the socket. While such assemblies readily permit the manual field replacement of the integrated circuit after the assembly has left the factory, no provision is made for mechanically or electrically protecting the external leads of the IC during such replacement. Thus during the manual process of inserting the IC into the socket, the IC leads may be bent or broken off due to mishandling. In addition, many IC's can be permanantly electrically damaged due to the external leads being subject to static electric discharge voltages which may be transmitted to the leads during manual handling and insertion of the IC.

Some integrated circuit carriers have been previously provided. However, such carrier assemblies typically merely facilitate the handling and insertion of one or more IC's into a receiving socket but do not prevent static discharge damage to the IC or mechanical damage to the IC leads since typically even with the IC mounted on its carrier the IC leads are exposed and therefore susceptible to static and mechanical damage.

The integral external leads normally provided on an IC by the IC manfacturer are typically relatively flimsy since the IC is intended for only a limited number of direct insertions into a mating socket. Thus mechanical damage to the IC leads is a distinct possibility whenever repeated mechanical and electrical connections to the IC leads have to be made by directly inserting the IC leads into a socket, especially if manual, rather than machine, insertion is contemplated. In addition, many times connecting a heat sink to the IC package may be required so as to dissipate heat generated by the integrated circuit. Typically elaborate additional heat sinks must then be provided and prior IC carriers have not provided any such heat sink capability.

In some prior IC subassemblies the IC is mounted to an intermediate printed circuit (PC) board to which, in addition to possibly other components, one half of a standard pin and socket connector is mounted, this IC carrier subassembly being intended for mating with the other half of the pin and socket connector which is mounted to a base (mother) PC board. Typically these types of IC subassemblies are costly due to the requirement of the intermediate PC board and the making of the electrical connections from this board to both the IC and the one half of the connector. These IC carrier subassemblies are also bulky due to the inclusion of the intermediate PC board and the typical requirement of enclosing the IC and all exposed intermediate PC conductors so that the carrier subassembly can be manually handled in the field with a minimum risk of damage to the IC.

Prior IC carrier subassemblies typically permit some contact between the subassembly leadouts and a mating connector portion even if the subassembly and the connector portion are not properly aligned. This can result in mechanical or electrical damage to the IC and/or other components. This may occur even though keying structure is provided to insure that the carrier subassembly will not fully mate with the connector portion.

SUMMARY OF THE INVENTION

An object of the present invention is to provide an improved integrated circuit carrier and assembly which overcomes the aforementioned deficiencies.

A more particular object of the present invention is to provide an improved integrated circuit carrier and assembly in which static discharge and mechanical lead damage is prevented which may occur during manual effective mating of the integrated circuit carrier with a socket.

An additional object of the present invention is to provide an integrated circuit carrier and assembly which provides an integral heat sink that either by itself, or together with additional heat sinks, conducts heat away from the IC.

In one embodiment of the present invention an improved integrated circuit carrier is provided comprising: a main carrier member having a horizontal portion suitable for mounting an integrated circuit (IC) thereto, said integrated circuit comprising an integral package having a main body and at least two substantially parallel rows of pluralities of electrically external leads extending outward from said main body, said main carrier member having at least two substantially parallel rows of openings in said horizontal portion, each opening associated with and suitably located and dimensioned for effectively receiving at least a portion of one said IC external leads, said two parallel rows of openings arranged substantially longitudinally overlapping and being normally spaced apart by a dimension at least large enough to permit finger access therebetween, said main carrier member having walls substantially extending vertically from said horizontal portion and forming, on at least one vertical side of said horizontal portion, at least one effective carrier channel surrounding at least one of said rows of openings, thereby effectively recessing said openings within said carrier channel, said carrier member configured to prevent finger access to said openings of said one row of openings within said channel from at least said one vertical side of said horizontal portion.

Preferably, the main carrier member is provided with separate carrier channels surrounding each of the rows of openings. Each opening is preferably provided with a carrier contact having a receptacle opening for mating with an associated one of the IC leads and an extending pin portion which forms an electrical projection that extends into one of the carrier channels. The pin portions of the carrier contacts and the carrier channels are dimensioned such that finger access from one vertical side of the horizontal portion to both the openings in the horizontal portion and the extending projections is prevented thus aiding in protecting, during manual handling, the IC from static discharge damage as well as preventing mechanical damage to the extending pin portions which are intended for subsequent mating with socket contacts mounted in a socket subassembly. If heat sinking of the IC is required, a metallic heat sink plate is provided fixed to the horizontal portion of the main carrier member with end portions of the heat sink extending beyond the IC body and the main carrier member to permit coupling the heat sink to additional heat sinks, if necessary.

The IC carrier described above is intended for mating with an IC to form an IC carrier subassembly wherein either the IC leads directly protrude through the openings in the horizontal portion to form recessed extending projections in the carrier channels, or the IC leads are received by carrier contacts mounted in the horizontal portion openings with extending pin portions of the contacts forming the recessed projections in the carrier channels. Since the extending projections in the carrier channels are intended for direct removable mating with socket contacts in a socket subassembly, the latter construction described above which uses carrier contacts enables the selection of substantial diameter dimension carrier pin portions thus ruggedizing the IC carrier subassembly since the typically more flimsy integrated circuit leads will not have to be repeatably inserted into receiving contacts in the socket subassembly.

An additional feature of the present invention deals with providing two additional carrier contacts in the horizontal portion which do not mate with integrated circuit leads but are directly electrically shorted together. These two additional carrier contacts mate with two additional socket contacts and provide an electrical indication signifying the complete mating of the carrier subassembly with the socket subassembly, since upon complete mating of the subassemblies the corresponding additional socket contacts will also be directly shorted together.

Preferably the present invention contemplates providing the carrier channels on one vertical side of the horizontal portion while the IC main body is located on the vertical side of the horizontal portion which is opposite to the channel vertical side. Also preferably a cover is effectively provided over the IC main body which together with the main carrier member and the horizontal portion thereof forms a protective cavity surrounding the IC main body.

Preferably, the main IC carrier member and a mating main socket member of the socket subassembly are formed by injection molded plastic material and the main carrier and socket members are provided with mating guide (key) projections and recesses to insure the proper alignment of the main carrier member with the main socket member while insuring that these components cannot be even partially mated such that socket contacts will be brought into contact with nonassociated carrier contact extending projections in the carrier channels.

The structures corresponding to the above recited components as well as additional features and advantages of the present invention are discussed subsequently in connection with the detailed description of the preferred embodiment.

BRIEF DESCRIPTION OF THE DRAWINGS

For a more complete understanding of the invention reference should be made to the drawings, in which:

FIG. 2 is a cross sectional view of the assembly shown in FIG. 1 after partial additional assembly thereof;

DESCRIPTION OF THE PREFERRED EMBODIMENT

Figure 1:
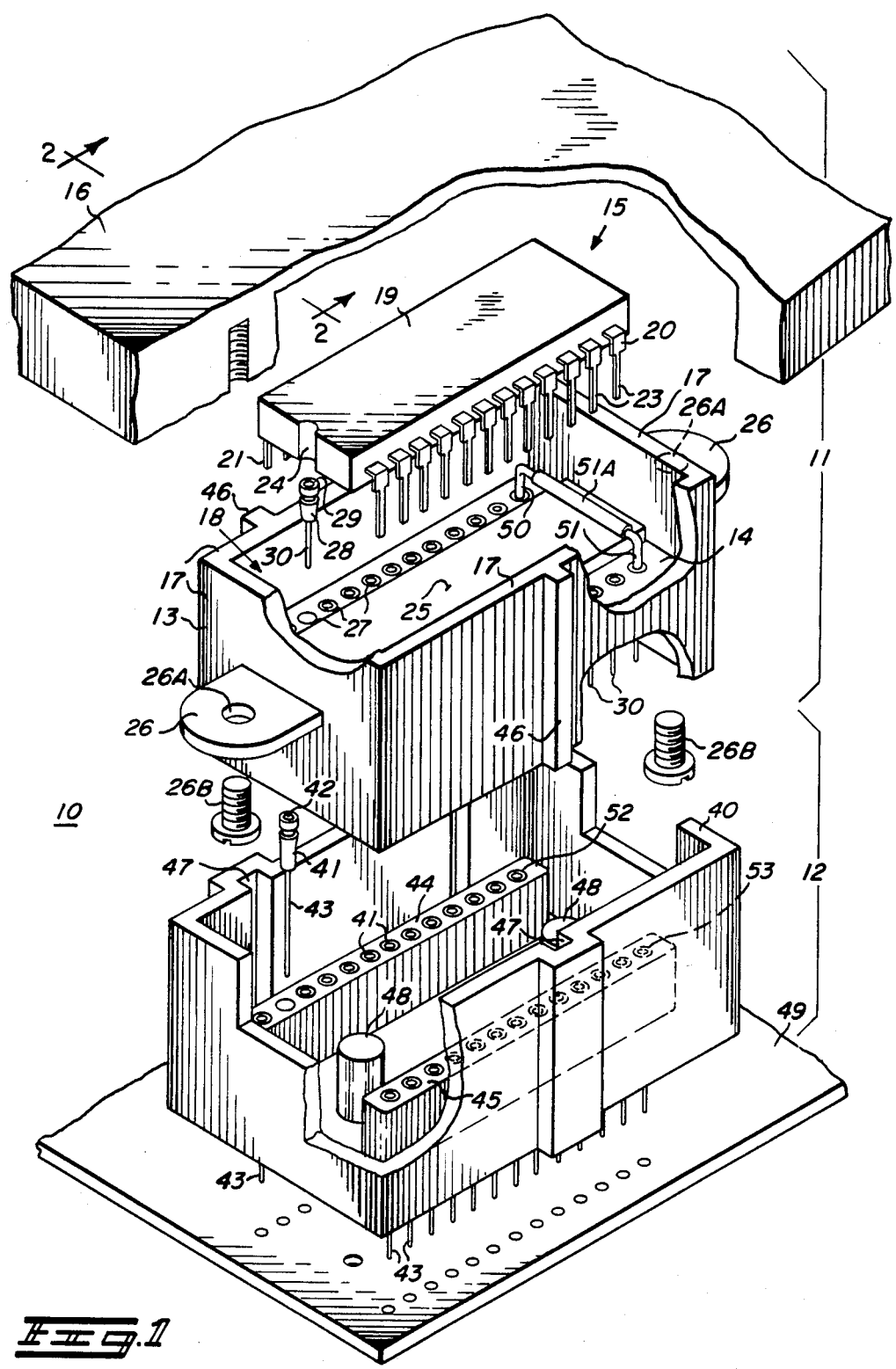
FIG. 1 is a partially exploded perspective assembly view of an IC carrier and assembly constructed in accordance with the present invention.

Referring to FIG. 1 a partially exploded view of an integrated circuit (IC) assembly 10 is illustrated. The IC assembly 10 basically comprises an IC carrier subassembly 11 and a socket subassembly 12 each being removably electrically and mechanically connectable to one another. The IC carrier subassembly 11 basically comprises a main carrier member 13 having an integral planar horizontal portion 14, an integrated circuit (IC) 15 mounted to said main carrier member 13 and a metal chassis plate cover member 16. The cover member 16 together with top vertical sidewalls 17 of the carrier member 13 that extend upward from said horizontal portion 14 and provide protective shoulders for the IC form a closed cavity 18 wherein a main body 19 of the IC 15 is located. The sidewalls 17 extend upward beyond the IC main body 19.

Figure 3:
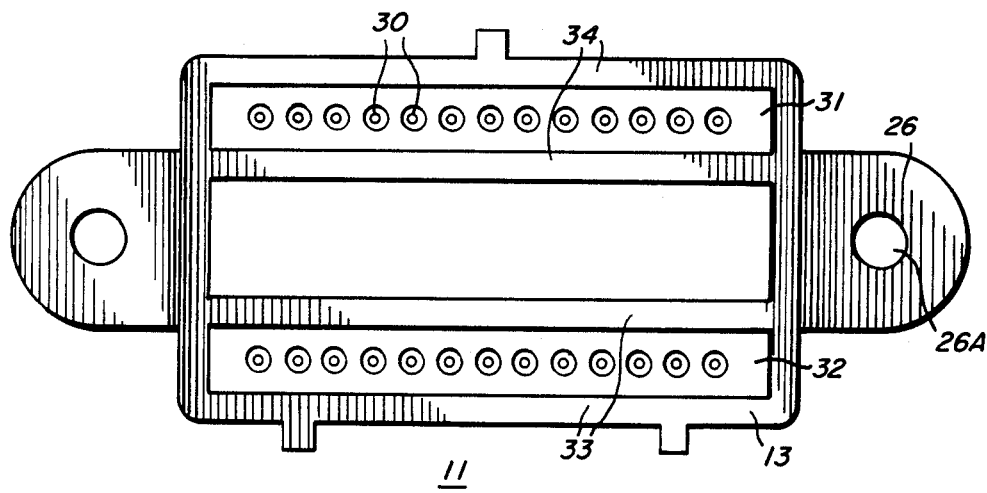
FIG. 3 is a planar bottom view of a carrier subassembly which forms part of the assembly shown in FIGS. 1 and 2.
Figure 4:
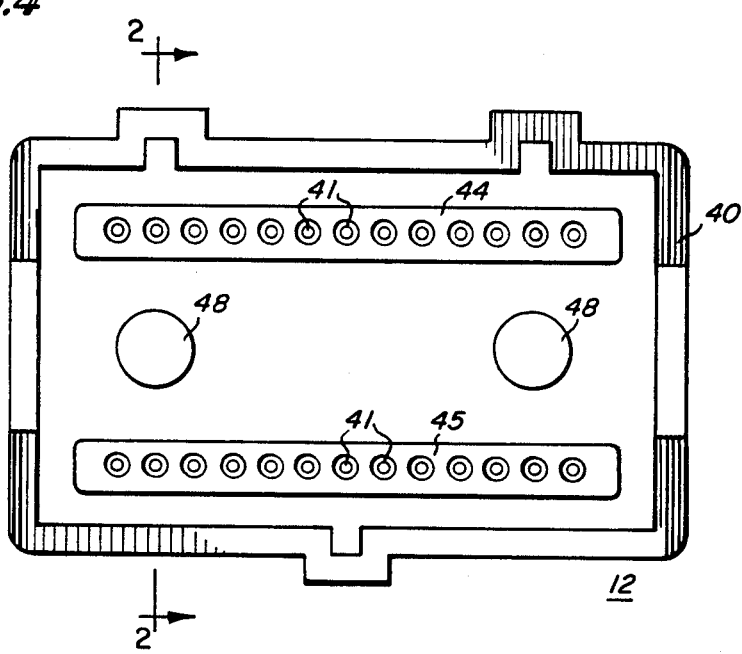
FIG. 4 is a top planar view of a socket subassembly which forms part of the assembly shown in FIGS. 1 and 2.

It should be noted that the terms "horizontal" and "vertical" are relative terms denoting general but not necessarily precise or substantial orthognal relationships. Also these terms, along with the terms "top", "bottom", "up" and "down", and derivatives thereof are utilized to describe the orientation of components as generally illustrated in FIGS. 1 and 2. It should also be noted that all of the FIGS. 1 through 4 illustrate the integrated circuit assembly 10 or portions thereof, and that therefore identical reference numbers are used in all the figures to identify corresponding elements. FIG. 2 illustrates in cross section the most significant components in the carrier and socket subassemblies 11 and 12 just prior to their mating, but after substantial assembly thereof. In FIG. 2 the IC 15, carrier contacts (28) and socket contacts (41) are not shown in cross section in order to maintain the clarity of the drawing. FIG. 3 illustrates a bottom view of the carrier subassembly 11, while FIG. 4 illustrates a top view of the socket subassembly 12.

The IC 15 comprises an integral package which includes the main body 19 and at least two substantially parallel rows 20 and 21 of pluralities of electrically external IC leads 23 which extend outward from the main body 19. The IC main body is substantially shaped as a rectangular parallelepiped having an orientation notch 24 at one end. Preferably the IC 15 corresponds to a standard dual-in-line integrated circuit with all of the integrated circuit external leads 23 primarily effectively extending outward and away from said IC main body 19 in substantially the same single direction which is illustrated as the downward direction in FIGS. 1 and 2.

For integrated circuits such as the IC 15 shown in FIG. 1 typically the normal spacing between the two parallel rows of extending leads 23 comprises either a nominal minimum spacing dimension of 0.3 inches or a nominal dimension of 0.6 inches depending upon which of the several standard integrated circuit packages are utilized for the IC 15. It should be noted that the minimum normal spacing between the external lead rows 20 and 21 is a dimension (0.3 inches) at least large enough to permit finger access therebetween wherein this terminology is used to designate the fact that it is possible to insert a major portion of a human finger between the external lead rows 20 and 21. The significance of this will become apparent subsequently since a primary feature of the present invention is to recess extending projections corresponding to each of the external leads 23 so as to prevent finger access to these projections. Thus preventing finger access to these projections will require some carrier member structure which is between the rows of projections.

The main IC carrier member 13 and its horizontal portion 14 are preferably formed by injection molding a platic material about a horizontal metal heat sink plate member 25 that is fixed to the main carrier member 13 and has two end portions 26 which extend horizontally beyond the top vertical sidewalls 17 of the main carrier member 13. Through hole openings 26A are provided in each end portion 26, and self tapping screws 26B are positioned therein for joining the heat sink plate 25 to the metal cover member 16.

The main carrier member 13 has at least two substantially parallel rows of through hole openings 27 in the horizontal portion 14 with each opening 27 being associated with and dimensioned for effectively receiving at least a portion of one of the IC external leads 23. The openings 27 provide two rows of openings corresponding to the IC lead rows 20 and 21 and there are at least as many openings 27 as there are IC leads 23. The distance between the rows of openings is a dimension at least large enough to permit finger access between the rows.

The IC main body 19 is preferably substantially formed of thermally conductive ceramic and is mounted on and contacts the heat sink plate member 25 which effectively forms part of the horizontal portion 14 of the main carrier member 13, with the end portions 26 of the heat sink member extending beyond the ends of the IC main body 19. It should be noted that when heat sinking the IC is not necessary the heat sink plate 25 can be eliminated.

Preferably, the IC carrier subassembly 11 includes a plurality of metallic carrier contacts 28 at least equal in number to the number of IC leads 23. Each carrier contact has a receptacle opening 29 at one end thereof and an extending pin portion 30 at an opposite end thereof. Each of the carrier contacts 28 is mounted in an associated one of the openings 27 in the horizontal portion 14 of the main carrier member. The extending pin portion 30 vertically extends downward from the horizontal portion 14 into an effective carrier channel formed on at least one vertical side of said horizontal portion, said one vertical side corresponding to the bottom side of the main carrier member 13 as viewed in FIGS. 1 and 2. For clarity, in FIG. 1 all carrier contacts 28, except one, are shown already inserted in their associated openings 27.

Essentially the present invention provides at least two substantially parallel rows of extending electrical projections, preferably corresponding to the extending pin portions 30 of the carrier contacts 28, with each projection corresponding to one of the IC leads 23 and extending in a substantially vertical linear direction from an associated one of the openings 27 in said horizontal portion 14. The two rows of openings 27 and their corresponding rows of projections (extending pin portions 30) are arranged substantially longitudinally overlapping and are spaced apart by a normal dimension between the rows at least large enough to permit finger access therebetween. Thus the spacing between the rows of openings 27 in the horizontal portion 14 is contemplated as corresponding to the spacing between the rows 20 and 21 of the IC leads 23.

The term "substantially longitudinally overlapping" is used to designate the fact that the longitudinal dimensions defined by the use of the term "row" are such that since two rows are stated to be parallel there will exist a substantial overlap (normal projection) of each of row with respect to one another. Another way of defining this term is that the two parallel rows are arranged such that the normal (perpendicular) projection of one of the parallel rows will substantially overlap the other row.

A primary feature of the present invention concerns recessing the extending projections which correspond to the pin portions 30 such that finger access to the projections is prevented. This is accomplished in the following manner. The main carrier member 13 has walls which extend substantially vertically downward from the horizontal portion 14 and extend parallel to and in the same direction and substantially beyond the extending pin portions 30. These walls essentially form two separate rectangular carrier channels 31 and 32 which are best illustrated in FIGS. 2 and 3. Each of the carrier. channels surrounds one row of extending pin portions 30 and the pin portions and carrier walls are configured to prevent finger access to the pin portions 30 from at least the vertical side of the horizontal portion 14 on which the carrier channels are formed (the bottom side), thus effectively recessing the pin portions 30 within the carrier subassembly 11. This is accomplished by making sure that channel width dimensions 31A and 32A of the channels 31 and 32, respectively, and the dimensions 30A that the pin portions 30 extend into the channels from the openings 27 provide the desired result. See FIG. 2. The IC main body 19 is located on the vertical side (top side) of the horizontal portion 14 which is opposite to the vertical side on which the channels 31 and 32 are formed, and the IC leads 23 are each received in the receptacle openings 29 of associated ones of the contacts 28 mounted in the openings 27 in the horizontal portion 14. Each of the carrier contact pins 30 serves as a linear downward continuing extension of one of the IC leads 23 from one of the openings 27.

It is contemplated that in some instances a cost savings may be implemented by eliminating the carrier contacts 28 and thus mounting the IC leads 23 directly through the openings 27 with the portions of the IC leads that extend through the horizontal portion 14 forming extending pin projections that extend into the channels 31 and 32. While ths configuration saves the cost of the plurality of carrier contacts 28, this must be balanced against the desirability of utilizing the separate contacts 28 wherein the contact pin portions 30 can be made substantially more rugged than the extending end portion of the IC leads 23 thus ruggedizing the IC carrier subassembly 11 of the present invention.

Preferably the contacts 28 are press fit into the openings 27 with each receptacle opening 29 subsequently receiving one of the IC leads 23 when the IC 15 is mounted to the main carrier member 13. The IC leads are then soldered to the contacts 28 creating an integral subassembly. The IC 15 is to be inserted by machine at the subassembly manufacturing plant onto the main carrier member 13 with the contacts 28 being previous press fit into the carrier member 13. The machine insertion substantially eliminates the danger of static discharge and IC lead damage during the construction of the carrier subassembly 11. It is contemplated that while the receptacle openings 29 are shown within the openings 27, other carrier contact configurations can be utilized such as each contact 28 having its receptacle opening fixed above the opening 27 with an extension of the contact 28 fitted within the opening 27. This will still result in a portion of the IC leads 23 being effectively received in the openings 27.

It should be noted that the carrier channels 31 and 32 are each substantially formed by separate pairs 33 and 34 of longitudinal walls parallel to the rows of openings with each of the carrier channels 31 and 32 located on the same vertical side (bottom side) with respect to the horizontal portion 14. Each of the channels 31 and 32 is substantially similar in configuration and each has a substantially rectangular shape and is oriented substantially longitudinally parallel to one another. While two individual carrier channels 31 and 32 are illustrated as the preferred embodiment of the present invention, the present invention also contemplates providing a single carrier channel for a effectively surrounding and recessing at least one of the rows of pin portions 30, or both of the rows of pin portions 30, while preventing finger access to the surrounded and recessed row or rows of pin portions 30. Main carrier member posts and partial wall projections can also be used to effectively define one or both of the channels 31 and 32 and also to prevent finger access to the pin portions 30 within the channel.

Due to the above recited structure, the IC carrier subassembly 11 prevents finger access to any of the IC leads 23 or the contacts 28 electrically connected thereto. However, access to the contacts 28 is still possible from the bottom side of the carrier assembly by providing a socket subassembly which has mating portions that fit within the carrier channels 31 and 32. This results in preventing the risk of static discharge damage to the integrated circuit 15 due to manual handling of the carrier subassembly 11 and contact of the pin portions 30 during the manual mating of the IC carrier subassembly 11 with the socket subassembly 12. This manual mating may be necessary when the carrier assembly is being replaced at locations remote from any factory site.

As was previously stated, the IC carrier subassembly 11 mates with a socket subassembly 12. The socket subassembly includes a main socket member 40 which is preferably made of injection molded plastic. The main socket member 40 has at least two substantially parallel rows of pluralities of metallic socket contacts 41 fixed thereto (preferably press fit into openings therein) with each of the socket contacts having an effective receptacle portion comprising a receptacle opening 42 at one end thereof and an extending pin 43 at an opposite end thereof. The extending pins 43 extend beyond the main socket member 40. The socket contacts 41 essentially form linear downward extensions of their associated carrier contacts when the subassemblies are properly mated. The number of socket contacts is at least equal to the number of extending projections corresponding to the number of extending pin portions 30. Each of the socket receptacle openings 42 is removably matable with and adaptable for receiving an associated one of the carrier extending projections corresponding to the pin portions 30. Each row of the socket contacts 41 is mounted on an associated one of two raised island portions 44 or 45 of the main socket member 40 with each of the raised island portions 44 and 45 and the socket receptacle openings 42 mounted thereon dimensioned for being positionable within an associated one of the effective carrier channels 31 and 32, respectively, with each of the pin portions 30 being received in an associated one of the socket contact receptacle openings 42. In this manner electrical connection to the IC 15 can be accomplished by plugging the IC carrier subassembly 11 into the socket subassembly 12 without risking manual damage to the IC due to static discharge or manual damage to the IC leads 23 or the pin portions 30 due to mishandling.

While the prefered configuration of each of the socket contacts 41 is a receptacle opening at one end and a pin at the other, these contacts can comprise pins at both ends if the carrier contact extending projections corresponding to the pin portions 30 now have a female (receptacle opening) shape rather than a male (pin) shape. Again it is contemplated that the carrier projections corresponding to the pin portions 30 would be recessed with the channels 31 and 32 to prevent finger access. The socket pins which would now mate with the carrier contact receptacle openings can be considered "effective socket receptacle portions". The terminology "socket receptacle portions", as used herein, refers to the socket contact portion which mates with a carrier contact regardless of whether the socket receptacle portion has a male or female configuration.

To insure the proper orientation and seating of the carrier subassembly 11 with the socket subassembly 12, the main carrier member 13 and the main socket member 40 are provided with longitudinally vertically orientated mating projections and recesses 46 and 47, respectively, on sidewalls thereof, some of these sidewalls forming the channels 31 and 32. The projections and recesses 46 and 47 permit the joining of the carrier and socket subassemblies in only one desired orientation and also form guides to insure the proper joining of the carrier and socket subassemblies. It is significant that the guide projections and recesses 46 and 47 are located and dimensioned such that keying (proper horizontal alignment) of the carrier and socket subassemblies must occur due to the mating engagement of the guide members 46 and 47 prior to any socket contact 41 coming into engagement with any carrier contact 28. This minimizes the possibility of damage due to wrong partial or complete attempted mating of the subassemblies.

The main socket member 40 includes at least one and preferably two cylindrical mounting posts 48 located between said raised socket islands 44 and 45. The mounting posts having a mounting hole therein to permit fixing said main socket portion 40 to a further assembly member comprising a printed circuit board 49. Self tapping mounting screws pass through holes in the board 49 and into the holes in the mounting posts 48. The position of the mounting posts 48 between the raised islands is advantageous since it saves space by providing socket PC mounting structure within the external dimensions defined by the raised islands. Thus the mounting structure posts do not increase the size of the main socket member. The printed circuit board has holes or eyelets therein for receiving each of said extending pin portions 43 of the socket contacts with the extending pin portions being electrically connected to conductive patterns on the printed circuit board by a conductive means, preferably solder, located adjacent to the printed board holes.

In addition to each of the carrier contacts 28 which is associated with one of the IC leads 23, the present invention provides two additional carrier contacts 50 and 51 which are directly electrically connected to each other regardless of the electrical connections provided by and between the IC external leads 23 and the other carrier contacts 28. The direct electrical connection between the additional contacts 50 and 51 is preferably provided by a metal wire 51A inserted therebetween or by specially forming the contacts 50 and 51. Each of the contacts 50 and 51 has the same structure as was described with respect to the contacts 28. These additional contacts mate with additional socket contacts 53 and 54 (identical to the socket contacts 41) provided on the main socket member 40. The contacts 53 and 54 are are utilized to provide a signal indicative of when the carrier subassembly 11 has been fully mated with the socket subassembly 12 since only at that time will a direct electrical short circuit connection exist between the corresponding socket contacts 53 and 54. While the additional carrier contacts 50 and 51 are shown in FIG. 1 at the same ends of each of the rows of holes 27 in the main carrier member 13, obviously other locations for the additional carrier contacts can be provided.

In essence the present invention comprises having the socket subassembly 12 mounted to a printed circuit board 49 and serving as a fixed receptacle for removably receiving the IC carrier subassembly 11. The IC carrier subassembly is configured such that finger access to the IC leads 23 is substantially prevented thus minimizing the danger of static discharge damage to the IC or mechanical lead damage during the non-factory manual handling and insertion of the carrier subassembly. This is accomplished by recessing the IC leads 23 and/or their extending pin projections corresponding to the carrier contact pins 30 within effective carrier channels in the main carrier member 13. A heat sink plate 25 is provided in the carrier subassembly and has extending end portions 26 which enable coupling the heat sink plate 25 to additional external heat sinks for further heat dissipation capability. In addition, the present invention contemplates the top cover 16 of the carrier assembly as comprising a metal plate which together with the upper sidewalls 17 of the main carrier member 13 form a cavity enclosure to protect the IC 15 while the metal cover 16 provides additional heat sinking capability. Due to the configuration of the carrier channels of the present invention which substantially surround the two rows of extending pin portions 30 of the carrier contacts, and due to the alignment projections and recesses 46, it is substantially impossible to misinsert the carrier subassemmbly 11 onto the socket subassembly 12 thus insuring a minimal risk of damage to the extending pin projections in the carrier channel caused by attempted misjoining of the carrier and socket subassemblies.

While I have shown and described specific embodiments of the present invention, further modifications and improvements will occur to those skilled in the art. Such modifications could, for example, comprise providing the alignment recesses and/or projections 46 and 47 on the raised islands 44 and 45 rather than on sidewalls of the main socket member 40. Other possible modifications could comprise utilizing two or more stacked integrated circuits instead of the single integrated circuit 15 illustrated herein, and/or providing a recessed plastic snap-on cover while substantially eliminating the upper sidewalls 17 that form the IC cavity 18 of the IC carrier subassembly 11. All such modifications which retain the basic underlining principles disclosed and claimed herein are within the scope of this invention.

What is claimed is:
1. An integrated circuit (IC) carrier comprising:
   a main carrier member, having a horizontal portion suitable for mounting thereto an integrated circuit (IC)
   comprising an integral package having a main body and at least two substantially parallel rows of pluralities of electrically external leads extending outward from said main body,
   said main carrier member having at least two substantially parallel rows of openings in said horizontal portion, said two parallel rows of openings arranged substantially longitudinally overlapping and being normally spaced apart by a dimension at least large enough to permit finger access therebetween,
   said main carrier member having walls substantially extending vertically from said horizontal portion and forming, on at least one vertical side of said horizontal portion, at least one effective open carrier channel surrounding at least one of said rows of openings, thereby effectively recessing said openings within said carrier channel, said carrier member including means for preventing finger access to said openings of said one row of openings within said channel from at least said one vertical side of said horizontal portion, and
   a plurality of metallic carrier contacts each having a receptacle opening at one end thereof and an extending projection at an opposite end thereof, each of said carrier contacts being mounted in an associated one of said openings in said horizontal portion of said main carrier member with the extending projection extending from each opening in said row into said carrier channel, said carrier member means preventing finger access from said one vertical side of said horizontal portion to said projections which extend into said channel from said openings in said one row, while providing electrical access to said projections from said one vertical side.

2. An IC carrier according to claim 1 wherein extending walls of said main carrier member form two of said carrier channels with each carrier channel effectively surrounding one of said parallel rows of openings in said horizontal portion of said main carrier member, each of said carrier channels being located on said one vertical side of said horizontal portion and being substantially similar in configuration and each channel including means for preventing finger access, from said one vertical side of said horizontal portion, to the associated row of openings and extending projections which is surrounds.

3. An IC carrier according to claim 2 wherein each of said carrier channels is substantially rectangular in shape, said channels being spaced apart and each formed by separate pairs of longitudinal sidewalls parallel to said rows of openings.

4. An IC carrier according to claim 1 which includes a metallic heat sink plate member fixed to said main carrier member, said heat sink member located on the vertical side of said horizontal portion opposite to the vertical side said carrier channel is formed on.

5. An IC carrier according to claim 1 wherein at least two additional carrier contacts are provided on said horizontal portion, said two additional carrier contacts being directly electrically connected to each other by means other than an integrated circuit.

6. An integrated circuit (IC) carrier subassembly comprising:
a main carrier member having a horizontal portion, and
an integrated circuit (IC) mounted to said main carrier member,
said IC comprising an integral package having a main body and at least two substantially parallel rows of pluralities of electrically external leads extending outward from said main body,
said main carrier member having at least two substantially parallel rows of openings in said horizontal portion, each opening associated with and effectively receiving at least a portion of one of said IC external leads,
said carrier subassembly providing at least two substantially parallel rows of pluralities of extending electrical projections, each projection corresponding to an associated one of said IC leads and extending in a substantially vertical linear direction from an associated one of said openings in said horizontal portion, said two rows of openings and their corresponding rows of projections arranged substantially longitudinally overlapping and being normally spaced apart by a dimension at least large enough to permit finger access therebetween,
said main carrier member having walls forming, on at least one vertical side of said horizontal portion, at least one effective open carrier channel surrounding at least one of said rows extending projections, said walls extending substantially vertically from said horizontal portion parallel to and in the same direction and substantially beyond the extending projections and effectively recessing said projections within said carrier subassembly, said carrier member including means for preventing finger access to said projections in said channel from at least said one vertical side of said horizontal portion, while providing electrical access to said projections from said one vertical side,
wherein said IC main body is located on the vertical side of said horizontal portion opposite to the vertical side on which said channel is formed, and
wherein said carrier subassembly includes a plurality of metallic carrier contacts, at least equal in number to the number of IC leads, each contact having a receptacle opening at one end thereof and an extending pin portion at an opposite end thereof, each of said carrier contacts being mounted in an associated one of said openings in said horizontal portion of said main carrier member with the extending pin portion extending from each opening in said row of openings into said carrier channel and serving as said extending projection, said carrier member means preventing finger access from said one vertical side of horizontal portion to said pin portions which extend into said channel from said openings in said one row while providing electrical access to said pin portions from said one vertical side, each of said carrier contact receptacles effectively receiving an associated one of said IC leads.

7. An IC carrier subassembly according to claim 6 wherein extending walls of said main carrier member form two of said carrier channels with each carrier channel effectively surrounding an associated one of said parallel rows of openings in said horizontal portion of said main carrier member and its associated extending projections, each of said carrier channels being located on the same vertical side of said horizontal portion and being substantially similar in configuration and each channel including means for preventing finger access, from said one vertical side of said horizontal portion, to the associated row of openings and extending porjections which it surrounds.

8. An IC carrier subassembly according to claim 6 wherein at least two additional carrier contacts are provided on said horizontal portion, said two additional carrier contacts being directly electrically connected to each other regardless of the connection between the IC external leads and their associated carrier contacts.

9. An IC carrier subassembly according to claim 6 which includes a metallic heat sink member fixed to said main carrier member and in contact with said IC main body, said metallic heat sink member having at least one end portion which extends beyond said IC main body, whereby said extending portion permits coupling said heat sink member to an additional heat sink.

10. An integrated circuit (IC) carrier assembly comprising:
an IC carrier subassembly including a main carrier member having a horizontal portion, and an integrated circuit (IC) mounted to said main carrier member,
said IC comprising an integral package having a main body and at least two substantially parallel rows of pluralities of electrically external leads extending outward from said main body,
said main carrier member having at least two substantially parallel rows of openings in said horizontal portion, each opening associated with and effectively receiving at least a portion of one of said IC external leads,
said carrier subassembly providing at least two substantially parallel rows of pluralities of extending electrical projections, each projection corresponding to an associated one of said IC leads and extending in a substantially vertical linear direction from an associated one of said opening in said horizontal portion, said two rows of openings and their corresponding rows of projections arranged substantially longitudinally overlapping and being normally spaced apart by a dimension at least large enough to permit finger access therebetween,
said main carrier member having walls forming, on at least one vertical side of said horizontal portion, at least one effective open carrier channel surrounding at least one of said rows of extending projections, said walls extending substantially vertically from said horizontal portion parallel to and in the same direction and substantially beyond the extending projections and effectively recessing said projections within said carrier subassembly, said carrier member including means for preventing finger access to said projections in said channel from at least said one vertical side of said horizontal portion;
a socket subassembly being removably electrically and mechanically connected to said carrier subassembly, and including a main socket member,
said main socket member having at least two substantially parallel rows of pluralities of metallic socket contacts fixed thereto, each of said socket contacts having an effective receptacle portion at one end thereof and an extending pin at a opposite end thereof, the number of socket contacts being equal to at least the number of said carrier extending projections with the receptacle portion of each socket contact mating with an associated one of said carrier extending projections, said socket contacts being mounted in openings on portions of said main socket member, and at least one row of said socket contact receptacle portions and the portions of said main socket member on which said row of socket contact receptacle portions are mounted being positioned within said at least one effective carrier channel and mating with said one row of carrier extending projections with each of said projections being received by associated socket contact receptacle portions, whereby said carrier and socket subassemblies form an IC assembly in which said carrier subassembly carrying said IC can be removed from said socket subassembly and manually handled without incurring a substantial risk or IC electrical damage or mechanical lead damage, and wherein said IC main body is located on the vertical side of said horizontal portion opposite to said one vertical side on which said carrier channel is formed, and wherein said carrier subassembly includes a plurality of metallic carrier contacts at least equal in number to the number of IC leads, each carrier contact having a receptacle opening at one end thereof and an extending pin portion at an opposite end thereof, each of said carrier contacts being mounted in an associated one of said openings in said horizontal portion of said main carrier member with the extending pin portion extending from each opening in said row of openings into said carrier channel and serving as said extending projection, said carrier member means preventing finger access from said one vertical side of horizontal portion to said pin portions which extend into said channel from said openings in said one row while providing electrical access to said pin portions from said one vertical side, each of said contact receptacles effectively receiving an associated one of said IC leads.

11. An IC assembly according to claim 10 wherein extending walls of said main carrier member form two of said carrier channels with each carrier channel effectively surrounding an associated one of said parallel rows of openings in said horizontal portion of said main carrier member and its associated extending projections, each of said carrier channels being located on said one vertical side of said horizontal portion and being substantially similar in configuration and each channel including means for preventing finger access, from said one vertical side of said horizontal portion, to the associated row of openings and extending projections which it surrounds.

12. An IC assembly according to claim 11 wherein said carrier subassembly comprises a metallic heat sink plate member fixed to said main carrier member, said heat sink member contacting said IC main body and having at least one end portion extending beyond said main carrier member, whereby said extending heat sink end portion permits coupling said heat sink member to an additional external heat sink.

13. An IC assembly according to claim 12 wherein said heat sink member comprises a flat plate substantially located within an effective closed cavity at least partially formed by said main carrier member, said IC main body also being located within the cavity, and wherein said heat sink member includes at least two end portions which extend beyond said main carrier member and wherein each of said heat sink end portions has an opening therein to facilitate mounting said carrier subassembly to additional members, and wherein said heat sink end portions having openings therein are mounted to a metal chassis plate which together with sidewalls of said main carrier member form said cavity.

14. An IC assembly according to claim 10 wherein at least two additional carrier contacts are provided on said main carrier member horizontal portion and mate, respectively, with two associated socket contacts provided on said main socket member, said two additional carrier contacts being directly electrically connected to each other regardless of the electrical connection between the IC external leads the socket contracts and the other carrier contacts.

15. An IC assembly according to claim 10 wherein extending walls of said main carrier member form two of said carrier channels with each carrier channel effectively surrounding an associated one of said parallel rows of openings in said horizontal portion of said main carrier member and its associated extending projections, each of said carrier channels being located on said one vertical side of said horizontal portion and being substantially similar in configuration and each channel including means for preventing finger access, from said one vertical side, to the associated row of openings and extending projections which it surrounds.

16. An IC assembly according to claim 15 wherein said main carrier member and said main socket member have mating projections and recesses which join said carrier and socket subassemblies in only one desired orientation with respect to one another, said mating projections and recesses engaging each other prior to any of said extending projections engaging said effective socket receptacle portions.

17. An IC assembly according to claim 16 wherein said carrier walls which form said two effective carrier channels which recess said carrier projections are utilized to provide thereon some of said mating projections and recesses which join said carrier and socket assemblies in only one desired orientation, said mating projections being longitudinally vertical with respect to said horizontal portion and forming guides joining said carrier and socket subassemblies.

18. An IC assembly according to claim 15 wherein said effective carrier channels are formed by at least two sets of parallel main carrier member walls, each set of sidewalls effectively forming a carrier channel which mates with a raised socket island on which said socket contacts are mounted.

19. An IC assembly according to claim 18 wherein said main socket member comprises at least one mounting post located between said raised socket islands, said post having a mounting hole therein to permit fixing said socket main member to a further assembly member.

20. An IC assembly according to claim 19 wherein said further assembly member comprises a printed circuit board having holes therein for receiving each of said extending pin portions of said socket contacts, said extending pin portions of said socket contacts being electrically connected to conductive patterns on said printed circuit board by conductive means adjacent said printed circuit board holes.

21. An IC assembly according to claim 10 wherein said main body of said IC is positioned within a closed cavity formed by at least one wall of said main carrier member, which may include said horizontal portion, and a carrier cover fixed to said main carrier member.

22. An IC assembly according to claim 21 wherein said cavity is formed by four main carrier member sidewalls and said horizontal portion of said main carrier member, said four sidewalls vertically extending vertically upward beyond said IC main body and effectively recessing said IC by forming protecting shoulders therefore.

23. An IC assembly according to claim 10 wherein said main carrier member and said main socket member are injection molded integral plastic parts.

24. An IC assembly according to claim 23 wherein said carrier subassembly comprises a metallic heat sink plate member fixed to said main carrier member, said heat sink member contacting said IC main body and having at least one end portion extending beyond said main carrier member, whereby said extending heat sink end portion permits coupling said heat sink member to an additional external heat sink, and wherein said main carrier member is injection molded around said heat sink plate to form an internal assembly.

25. An IC assembly according to claim 10 wherein said carrier and socket contacts are press fit into corresponding holes in said main carrier and socket members, respectively.

26. An integrated circuit (IC) carrier and socket assembly comprising:
   an IC carrier including a main carrier member having a horizontal portion for mounting thereon an integrated circuit (IC)
   comprising an integral package having a main body and at least two substantially parallel rows of pluralities of electrically external leads extending outward from said main body,
   said main carrier member having at least two substantially parallel rows openings in said horizontal portion,
   said carrier, providing at least two substantially parallel rows of pluralities of extending electrical projections, each projection corresponding to an IC lead and extending in a substantially vertical linear direction from an associated one of said openings in said horizontal portion, said two rows of openings and their corresponding rows of projections arranged substantially longitudinally overlapping and being normally spaced apart by a dimension at least large enough to permit finger access therebetween,
   said main carrier member having walls forming, on at least one vertical side of said horizontal portion, at least one effective open carrier surrounding at least one of said rows of extending projections, said walls extending substantially vertically from said horizontal portion parallel to and in the same direction and substantially beyond the extending projections and effectively recessing said projections within said carrier, said main carrier member including means for preventing finger access to said projections in said channel from at least said one vertical side of said horizontal portion;
   a socket subassembly being removably electrically and mechanically connected to said carrier, and including a main socket member,
   said main socket member having at least two substantially parallel rows of pluralities of metallic socket contacts fixed thereto, each of said socket contacts having an effective receptacle portion at one end thereof and an extending pin at an opposite end thereof, the number of socket contacts being equal to at least the number of said carrier extending projections with the receptacle portion of each socket contact mating with an associated one of said carrier extending projections,
   said socket contacts being mounted in openings on portions of said main socket member, and at least one row of said socket contact receptacle portions and the portions of said main socket member on which said row of socket contact receptacle portions are mounted being positioned within said effective carrier channel and mating with said one row of carrier extending projections with each of said projections being received by associated socket contact receptacle portions, whereby said carrier and said socket subassembly form an IC assembly in which said carrier, when carrying said IC, can be removed from said socket subassembly and manually handled without incurring a substantial risk of IC electrical damage or mechanical lead damage, and
   wherein said carrier includes a plurality of metallic carriers contacts, each carrier contact having a receptacle opening at one end thereof and an extending pin portion at an opposite end thereof, each of said carrier contacts being mounted in an associated one of said openings in said horizontal portion of said main carrier member with the extending pin with the extending pin portion extending from each opening in said row of openings into said carrier channel and serving as said extending projection, said carrier member means preventing finger access from said one vertical side of horizontal portion to said pin portions which extend into said channel from said openings in said one row while providing electrical access to said pin portions from said one vertical side.

27. An IC assembly according to claim 26 wherein extending walls of said main carrier member form two of said carrier channels with each carrier channel effectively surrounding an associated one of said parallel rows of openings in said horizontal portion of said main carrier member and its associated extending projections, each of said carrier channels being located on said one vertical side of said horizontal portion and being substantially similar in configuration and each channel including means for preventing finger access, from said one vertical side of said horizontal portion, to the associated row of openings and extending projections which it surrounds.

28. An IC assembly according to claim 27 wherein said carrier comprises a metallic heat sink plate member fixed to said main carrier member, said heat sink member and having at least one end portion extending beyond said main carrier member, whereby said extending heat sink end portion permits coupling said heat sink member to an additional external heat sink.

29. An IC assembly according to claim 28 wherein said heat sink member comprises a flat plate substantially located within an effective closed cavity at least partially formed by said main carrier member, and wherein said heat sink member includes at least two end portions which extend beyond said main carrier member and wherein each of said heat sink end portions has an opening therein to facilitate mounting said carrier to additional members, and wherein said heat sink end portions having openings therein are mounted to a metal chassis plate which together with sidewalls of said main carrier member form said cavity.

30. An IC assembly according to claim 26 wherein at least two additional carrier contacts are provided on said main carrier member horizontal portion and mate, respectively, with two associated contacts provided on said main socket member, said two additional carrier contacts being directly electrically connected to each other regardless of electrical connections provided by said socket contacts.

31. An IC assembly according to claim 27 wherein said main carrier member and said main socket member have mating projections and recesses which join said carrier and said socket subassembly in only one desired orientation with respect to one another, said mating projections and recesses engaging each other prior to any of said extending projections engaging said effective socket receptacle portions.

32. An IC assembly according to claim 31 wherein said carrier walls which form said two effective carrier channels which recess said carrier projections provide thereon some of said mating projections and recesses which permit the joining of said carrier and socket assemblies in only one desired orientation, said mating projections being longitudinally verrtical with respect to said horizontal portion and forming guides joining said carrier and socket subassemblies.

33. An IC assembly according to claim 27 wherein said effective carrier channels are formed by at least two sets of parallel main carrier member walls, each set of sidewalls effectively forming a carrier channel which mates with a raised socket island on which said socket contacts are mounted.

34. An IC assembly according to claim 33 wherein said main socket member comprises at least one mounting post located between said raised socket islands, said post having a mounting hole therein to permit fixing said socket main member to a further assembly member.

35. An IC assembly according to claim 26 wherein said main carrier member and said main socket member have mating projections and recesses which join said carrier and said socket subassembly in only one desired orientation with respect to one another, said mating projections and recesses engaging each other prior to any of said extending projections engaging said effective socket receptacle portions.

36. An IC assembly according to claim 35 wherein said carrier walls which form said at least one effective carrier channel which recesses said carrier projections provide thereon some of said mating projections and recesses which permit the joining of said carrier and socket assemblies in only one desired orientation, said mating projections being longitudinally vertical with respect to said horizontal portion and forming guides joining said carrier and socket subassemblies.

37. An IC assembly according to claim 26 which includes a closed cavity formed by at least one wall of said main carrier member, and a carrier cover fixed to said main carrier member.

38. An IC assembly according to claim 37 wherein said cavity is formed by four main carrier member sidewalls and said horizontal portion of said main carrier member, said four sidewalls vertically extending vertically upward from said horizontal portion.

39. An IC assembly according to claim 26 wherein said main carrier member and said main socket member are injection molded integral plastic parts.

40. An IC assembly according to claim 39 wherein said carrier comprises a metallic heat sink plate member fixed to said main carrier member, said heat sink member and having at least one end portion extending beyond said main carrier member, whereby said extending heat sink end portion permits coupling said heat sink member to an additional external heat sink, and wherein said main carrier member is injection molded around said heat sink plate to form an internal assembly.

41. An IC assembly according to claim 26 wherein said carrier and socket contacts are press fit into corresponding holes in said main carrier and socket members, respectively.

* * * * *